(12) United States Patent
Kurokawa et al.

(10) Patent No.: US 10,651,948 B2
(45) Date of Patent: May 12, 2020

(54) COHERENT RECEIVER MODULE

(71) Applicant: SUMITOMO ELECTRIC INDUSTRIES, LTD., Osaka-shi (JP)

(72) Inventors: Munetaka Kurokawa, Osaka (JP); Yasushi Fujimura, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 16/388,020

(22) Filed: Apr. 18, 2019

(65) Prior Publication Data

US 2019/0327000 A1   Oct. 24, 2019

(30) Foreign Application Priority Data

Apr. 19, 2018 (JP) .................................. 2018-080749

(51) Int. Cl.
*H04B 10/61* (2013.01)
*H01L 31/0232* (2014.01)
(Continued)

(52) U.S. Cl.
CPC ......... *H04B 10/614* (2013.01); *G02B 6/0006* (2013.01); *G02B 6/4206* (2013.01);
(Continued)

(58) Field of Classification Search
CPC .. G02B 27/0961; G02B 27/30; G02B 6/0006; G02B 6/2813; G02B 6/4206;
(Continued)

(56) References Cited

U.S. PATENT DOCUMENTS

| 5,517,303 A | * | 5/1996 | Cole | ...................... G01D 5/268 250/227.19 |
| 7,194,155 B1 | * | 3/2007 | Kahn | ................. H04B 10/2581 385/27 |

(Continued)

FOREIGN PATENT DOCUMENTS

JP       2014-187506 A       10/2014

OTHER PUBLICATIONS

Soldano et al; Optical multi mode interference devices based on self-imaging Principles and applications; Apr. 1995; Journal of lightwave technology, vol. 13 No. 4; pp. 615-627. (Year: 1995).*

*Primary Examiner* — Amritbir K Sandhu
(74) *Attorney, Agent, or Firm* — Baker Botts L.L.P.; Michael A. Sartori

(57) ABSTRACT

The receiver including a package, first and second optical fibers, a capillary, and an array lens is disclosed. The first fiber has a first edge coupling to a MMI device by propagating a signal beam. The second fiber has a second edge coupling to the MMI device by propagating a local beam. The array lens has first and second lenses. The first lens converts the signal beam into a collimating beam, and the second lens converts the local beam into a collimating beam. The capillary has an edge opposite to the array lens, and the edge has a first region including the first edge and a second region including the second edge. The first edge is slanted to a first axis, and the second edge is slanted to a second axis, and a direction of the first edge and a direction of the second edge are different each other.

5 Claims, 13 Drawing Sheets

(51) Int. Cl.
  *G02B 6/42* (2006.01)
  *G02B 27/09* (2006.01)
  *G02B 27/30* (2006.01)
  *G02F 2/00* (2006.01)
  *F21V 8/00* (2006.01)

(52) U.S. Cl.
  CPC ......... *G02B 27/0961* (2013.01); *G02B 27/30* (2013.01); *H01L 31/02327* (2013.01); *H04B 10/6151* (2013.01); *G02F 2002/006* (2013.01)

(58) Field of Classification Search
  CPC ................ G02B 6/4207; G02B 6/4213; G02F 2002/006; H01L 31/02327; H04B 10/614; H04B 10/6151
  USPC .................................................. 398/202–214
  See application file for complete search history.

(56) References Cited

U.S. PATENT DOCUMENTS

| | | | | |
|---|---|---|---|---|
| 7,196,317 B1* | 3/2007 | Meissner, II | .......... | A61B 5/1115 250/227.14 |
| 9,419,723 B2* | 8/2016 | Takechi | ............... | H04B 10/614 |
| 10,401,883 B2* | 9/2019 | Swanson | ................ | G05D 25/02 |
| 2004/0184729 A1* | 9/2004 | Martin | ................ | G02B 6/3582 385/33 |
| 2006/0133713 A1* | 6/2006 | Yamada | ................... | G02B 6/30 385/5 |
| 2010/0054761 A1* | 3/2010 | Chen | ....................... | H04B 10/60 398/212 |
| 2012/0008951 A1* | 1/2012 | Mikami | ............... | H04B 10/613 398/65 |
| 2012/0134676 A1* | 5/2012 | Kikuchi | ............... | H04B 10/532 398/65 |
| 2014/0212137 A1* | 7/2014 | Watanabe | ........... | G02B 6/4215 398/65 |
| 2014/0215816 A1* | 8/2014 | Kurokawa | ........... | G02B 6/4225 29/832 |
| 2015/0117865 A1* | 4/2015 | Sonoda | ............ | H04B 10/07955 398/140 |
| 2017/0031099 A1* | 2/2017 | Fujimura | ............ | G02B 6/12004 |
| 2018/0006729 A1* | 1/2018 | Ashizawa | ......... | H04B 10/0779 |
| 2018/0356607 A1* | 12/2018 | Fujimura | ............. | G02B 6/4225 |
| 2019/0212506 A1* | 7/2019 | Fujimura | ............. | G02B 6/4239 |
| 2019/0250342 A1* | 8/2019 | Fujimura | ............. | G02B 6/4226 |
| 2019/0327000 A1* | 10/2019 | Kurokawa | ............. | G02B 27/30 |

* cited by examiner

Fig.6
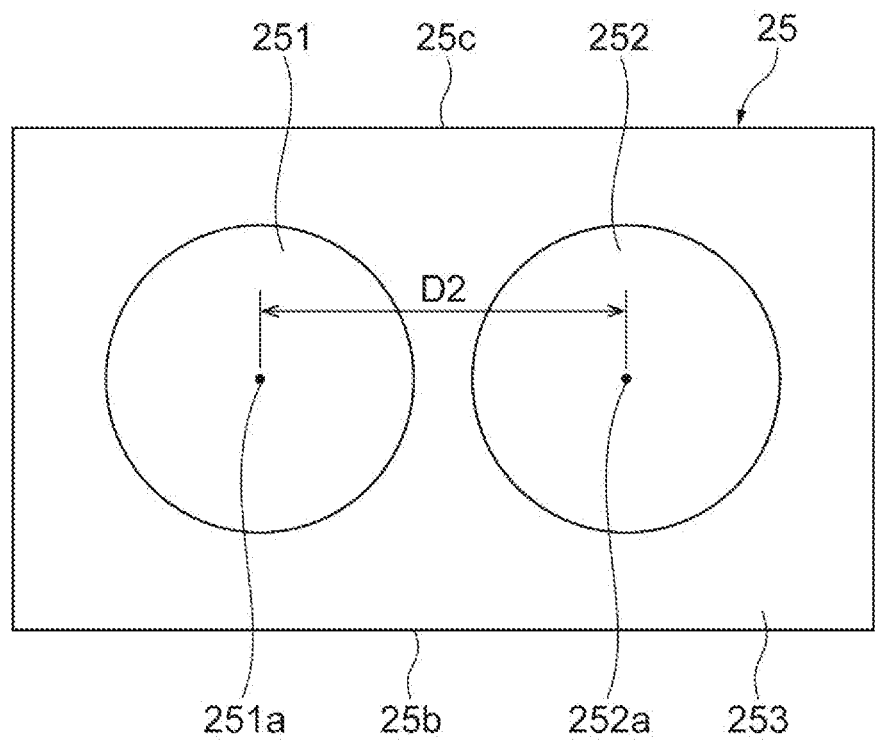
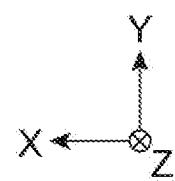

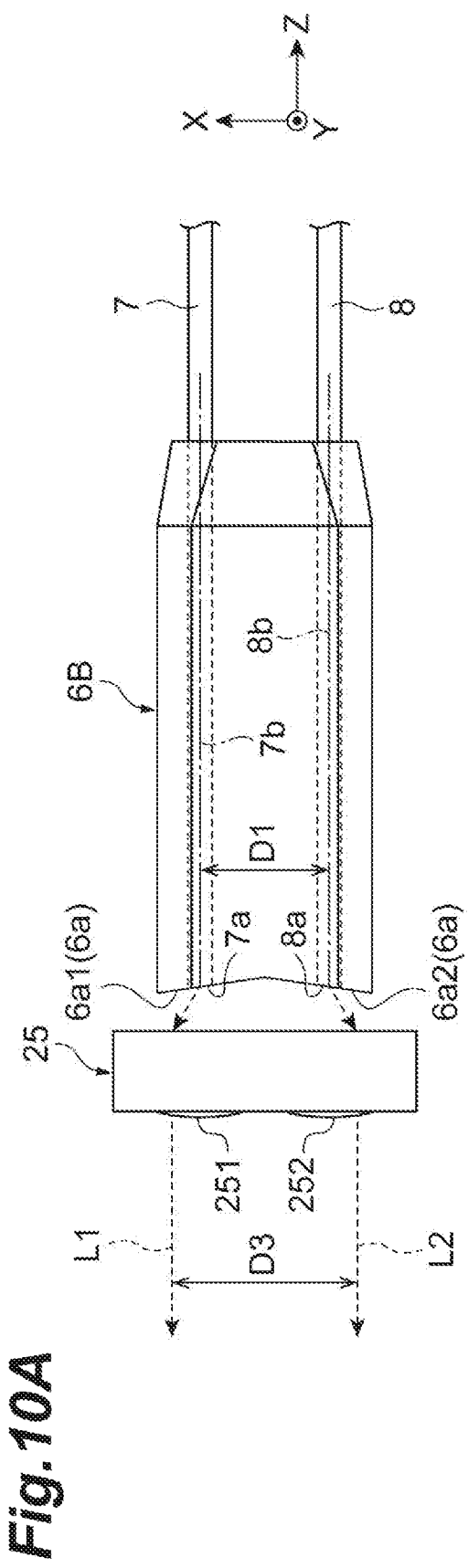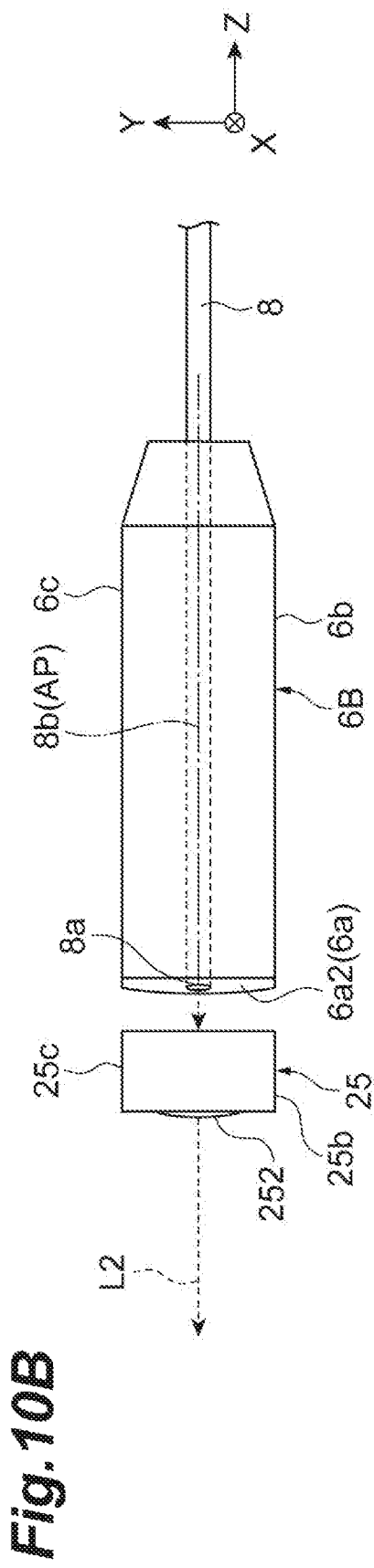

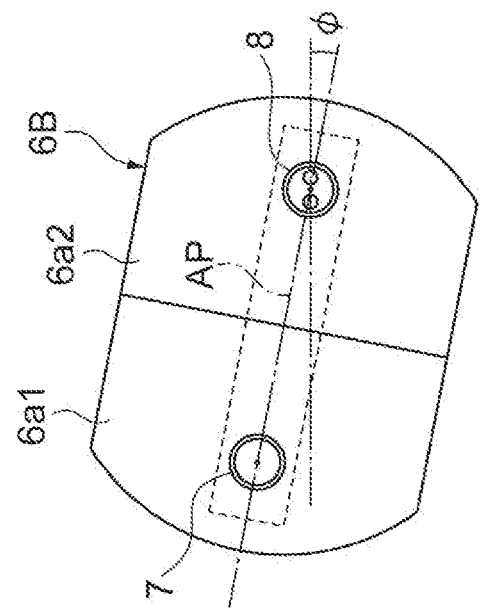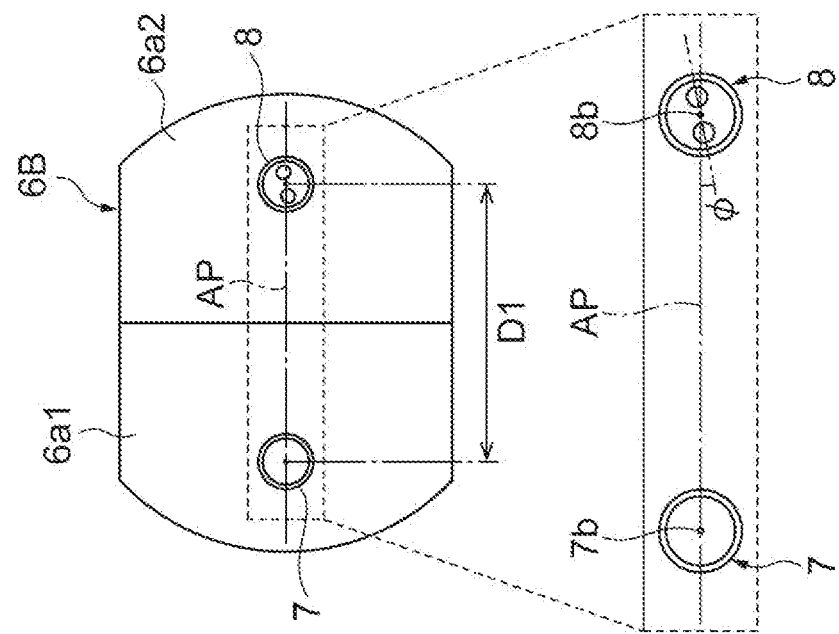

COHERENT RECEIVER MODULE

CROSS REFERENCE

The present application is based upon and claims the benefit of the priority from Japanese Patent Application No. 2018-080749 filed on Apr. 19, 2018, the entire contents of which are incorporated herein by reference.

TECHNICAL FIELD

The present disclosure relates to a coherent receiver module.

BACKGROUND

JP2014-187506A discloses a receiver module used for coherent optical communications. At one end of a housing of this receiver module, there are provided, side by side, a connector connected to a single mode fiber (SMF) for introducing a signal beam and a connector connected to a polarization maintaining fiber (PMF) for introducing a local beam.

SUMMARY

The present disclosure provides a receiver. The receiver comprises a package, a first optical fiber, a second optical fiber, a capillary, and an array lens. The package houses a multi-mode interference (MMI) device. The first optical fiber has a first edge coupling to the MMI device by propagating a signal beam, and is inserted into inside from outside of the package. The second optical fiber has a second edge coupling to the MMI device by propagating a local beam, and is inserted into inside from outside of the package along with the first optical fiber. The capillary holds heads of the first and second optical fibers, and is housed in the package. The array lens has a first lens, a second lens, and a connection fixing the first lens and the second lens. The first lens converts the signal beam into a first collimating beam and is located on a first optical axis of the first optical fiber, and the second lens converts the local beam into a second collimating beam and is located on a second optical axis of the second optical fiber. The capillary has an edge opposite to the array lens, and the edge has a first region including the first edge and a second region including the second edge. The first edge is slanted to the first optical axis, and the second edge is slanted to the second optical axis, and a direction of the first edge and a direction of the second edge are different each other.

BRIEF DESCRIPTION OF THE DRAWINGS

The foregoing and other purposes, aspects and advantages will be better understood from the following detailed description of embodiments of this disclosure with reference to the drawings, in which:

FIG. 6 is a front view of an array lens;

FIG. 10A is a plan view of the capillary and the array lens in a state in which they face each other, and FIG. 10B is a side view of the capillary and the array lens in the state in which they face each other;

FIG. 11A is a front view of the end, illustrating how the polarizing direction of a PMF is inclined by an angle $\phi$ with respect to a flat surface, and FIG. 11B illustrates how the capillary is rotated by the angle $\phi$ around an axis along a Z-direction;

DETAILED DESCRIPTION

Figure 1:
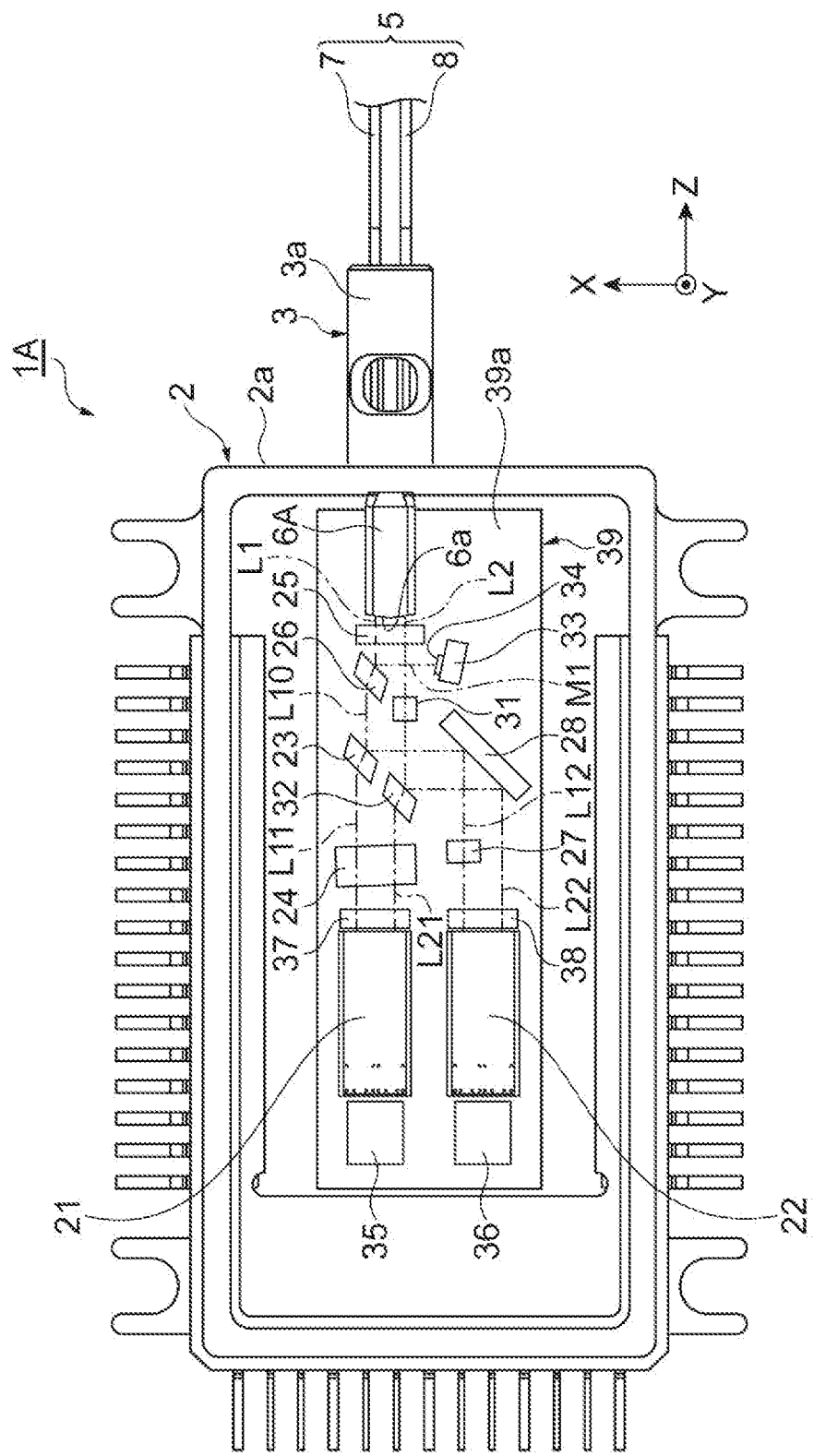
FIG. 1 is a plan view of the inner structure of a receiver module according to an embodiment.

[Problem to be Solved by the Present Disclosure]

As a receiver module to be used for digital coherent optical communications, a centum gigabit form factor pluggable (CFP) optical transceiver has been widely adopted. In recent years, transition to a CFP2 optical transceiver of a smaller size is progressing. In the future, a higher demand for an optical transceiver of a still smaller size is to be expected, and a further reduction in size of the receiver module mounted in the optical transceiver is desired.

[Advantageous Effect of the Present Disclosure]

The present disclosure can provide a receiver allowing a reduction in size.

Description of the Embodiments of the Present Disclosure

An embodiment of the present disclosure will be described in detail. A receiver according to an embodiment of the present disclosure comprises a package, a first optical fiber, a second optical fiber, a capillary, and an array lens. The package houses a multi-mode interference (MMI) device. The first optical fiber has a first edge coupling to the MMI device by propagating a signal beam, and is inserted into inside from outside of the package. The second optical fiber has a second edge coupling to the MMI device by propagating a local beam, and is inserted into inside from outside of the package along with the first optical fiber. The capillary holds heads of the first and second optical fibers, and is housed in the package. The array lens has a first lens, a second lens, and a connection fixing the first lens and the second lens. The first lens converts the signal beam into a first collimating beam and is located on a first optical axis of the first optical fiber, and the second lens converts the local beam into a second collimating beam and is located on a second optical axis of the second optical fiber. The capillary has an edge opposite to the array lens, and the edge has a first region including the first edge and a second region including the second edge. The first edge is slanted to the first optical axis, and the second edge is slanted to the second optical axis, and a direction of the first edge and a direction of the second edge are different each other.

This receiver introduces the first optical fiber and the second optical fiber into the interior of the package from the exterior thereof, and, instead of the connector structure disclosed in JP2014-187506A, accommodates in the package a capillary retaining the respective distal ends of the first optical fiber and the second optical fiber. In this configuration, it is possible to omit the connector structure protruding from the side of the package, making it possible to achieve a reduction in the size of the receiver. Further, the first lens and the second lens respectively provided with respect to the first optical fiber and the second optical fiber are integrated (arrayed) by the holder, so that it is possible to diminish the distance between the first lens and the second lens. In this configuration, the distance between the first optical fiber and the second optical fiber is diminished, making it possible to achieve a further reduction in the size of the receiver.

In the capillary, the normal of the first region including the first end of the first optical fiber is inclined with respect to the axis of the first optical fiber, and the normal of the second region including the second end of the second optical fiber is inclined with respect to the axis of the second optical fiber. This configuration suppresses reflection return light at the first end and the second end. Further, the orientation of inclination of the first region and the orientation of the inclination of the second region with respect to the virtual axis intersecting both the axis of the first optical fiber and the axis of the second optical fiber are opposite to each other. In this configuration, the distance between the first lens and the first end and the distance between the second lens and the second end are equal to each other, so that even in the case where the focal distances of the first lens and the second lens are equal to each other, it is possible to collimate both the signal beam and the local beam without diffusing them.

In one embodiment, a vector of the first region and a vector of the second region may be oriented in such a way as to approach each other. In another embodiment, a vector of the first region and a vector of the second region may be oriented in such a way as to point away from each other. In these embodiments, the orientation of inclination of the first region and the orientation of inclination of the second region with respect to the virtual axis can be opposite to each other. In the case where the vector of the first region and the vector of the second region are oriented in such a way as to approach each other, the signal beam and the local beam reach the array lens while moving away from each other because of Snell's law. In this configuration, the distance between the first optical fiber and the second optical fiber is further diminished, making it possible to achieve a further reduction in the size of the coherent receiver module.

In an embodiment, the first region and the second region may be perpendicular to the virtual surface including the axes of the first optical fiber and the second optical fiber. In this embodiment, the signal beam and the local beam are caused to progress along the virtual surface, making it possible to suppress shift of the optical path of the signal beam and the local beam in a direction interesting the virtual surface (e.g., the package height direction).

In an embodiment, the capillary and the array lens may be arranged on a deployment surface of a base housed in the package, and the heights of the axes of the first optical fiber and the second optical fiber using the surface of the capillary facing the deployment surface as a reference and the heights of the axes of the first lens and the second lens using the surface of the array lens facing the deployment surface as a reference may be equal to each other. This embodiment can facilitate the axis adjustment of each optical fiber and each lens in the height direction.

Detailed Description of the Embodiment of the Present Disclosure

Specific examples of the coherent receiver module according to an embodiment of the present disclosure will be described with reference to the drawings. The present invention is not restricted to these examples but is intended to include all modifications in the sense and scope equivalent to those set forth in the appended claims. In the following description, the same components in description of the figures are designated by the same reference numerals, and a redundant description will be left out. To facilitate the understanding, an XYZ orthogonal coordinate system is shown in each drawing.

Figure 2:
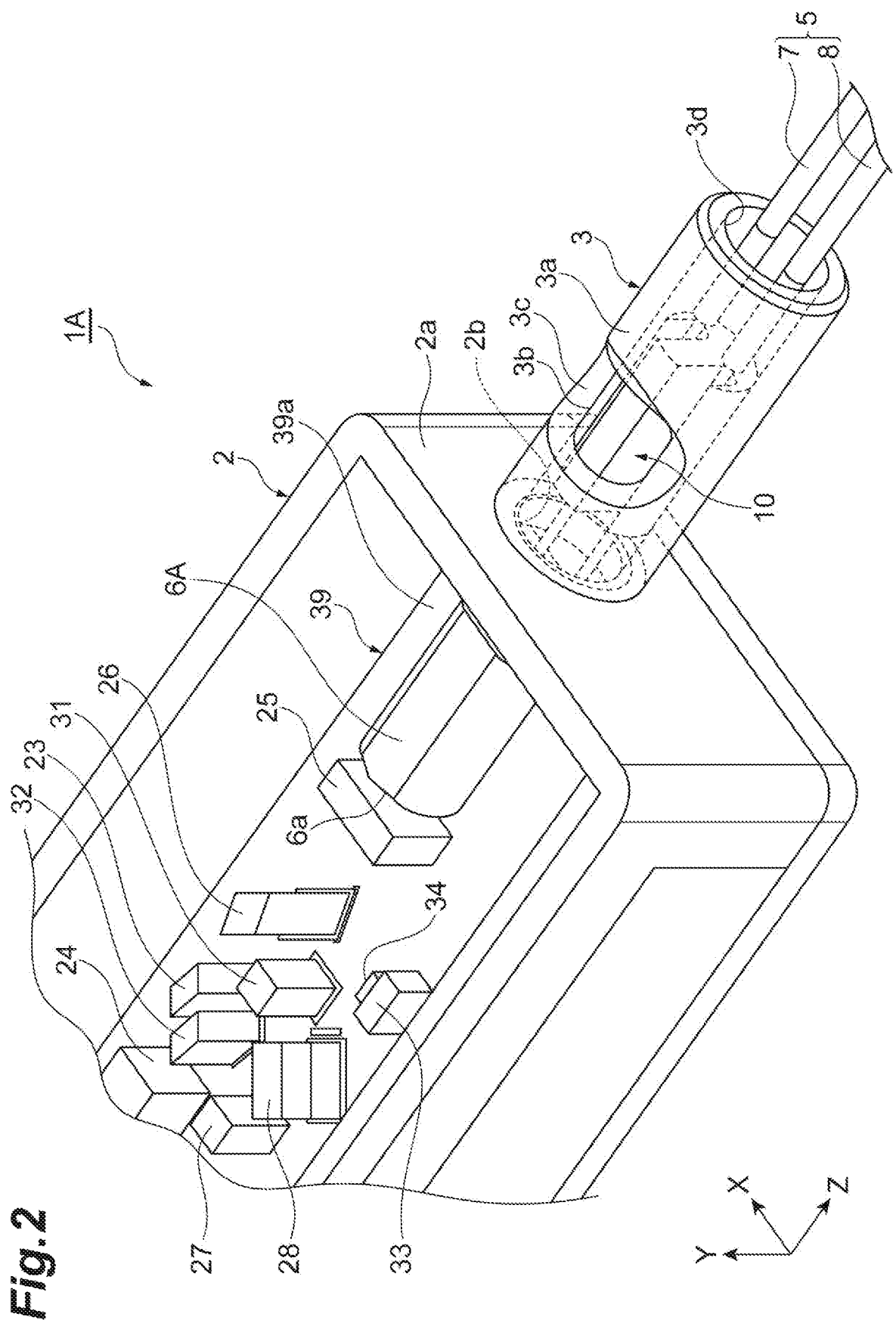
FIG. 2 is an enlarged perspective view of a coupling portion of the receiver module.

FIG. 1 is a plan view of the inner structure of a coherent receiver module (hereinafter simply referred to as the receiver module) 1A according to an embodiment. FIG. 2 is an enlarged perspective view of a coupling portion 3 of the receiver module 1A. The receiver module 1A is called Integrated Coherent Receiver (ICR), and causes a local oscillated beam (hereinafter referred to as the local beam) L2 to interfere with a received phase-modulated signal beam (hereinafter referred to as the signal beam) L1, thereby demodulating information included in the signal beam L1. The demodulated information is converted to an electric signal, and is output to the exterior of the receiver module 1A.

The receiver module 1A comprises a rectangular hollow package 2, and an introducing member 3 fixed to the package 2. The package 2 and the introducing member 3 are formed of the same material such as Kovar. The package 2 has four side walls. Of the four side walls of the package 2, a side wall 2a having a window 2b is provided with the introducing member 3, which is a tubular member having a center axis extending in the Z-direction. The introducing member 3 is a member for introducing a fiber, and protrudes to the exterior of the package 2 from the side wall 2a. The introducing member 3 is, for example, of a cylindrical shape extending in the Z-direction. In a side 3a of the introducing member 3, there is provided an opening 3b oriented in the Y-direction. The opening 3b is a bore for putting solder in the introducing member 3, and has, for example, at an edge portion, a flared edge 3c inclined with respect to the side 3a.

Fibers 5 and ferrules 10 are inserted into a bore 3d of the introducing member 3 oriented in the Z-direction, and the window 2b of the side wall 2a. The fibers 5 include a single mode fiber (SMF) 7 and a polarization maintaining fiber (PMF) 8. The SMF 7 extends along the Z-direction, and transmits a signal beam L1. The PMF 8 extends along the Z-direction, and transmits a local beam L2. The directions of the axes of the SMF 7 and the PMF 8 are parallel to each other. The SMF 7 is introduced into the interior of the package 2 from the exterior thereof via the window 2b. The PMF 8 is arranged side by side with the SMF 7 in the X-direction, and is introduced into the interior of the package 2 from the exterior thereof via the window 2b together with the SMF 7. The signal beam L1 and the local beam L2 are input to the interior of the package 2 respectively via the SMF 7 and the PMF 8.

The receiver module 1A further comprises a capillary 6A and an array lens 25. The capillary 6A is accommodated in the package 2, and retains the respective distal ends of the SMF 7 and the PMF 8. The capillary 6A extends along the axis direction (the Z-direction) of the SMF 7 and the PMF 8. From an end 6a of the capillary 6A, the respective ends of the SMF 7 and the PMF 8 are exposed. Further, the array lens 25 is situated in the axis direction (the Z-direction) of the SMF7 and the PMF8 with respect to the capillary 6A, and is opposite to the end 6a of the capillary 6A. The array lens 25 has two lenses arranged side by side in the X-direction. The first lens is optically connected with the SMF 7, is arranged on the optical path of the signal beam L1 output from the end of the SMF 7, and collimates the signal beam L1. The second lens is optically connected with the PMF 8, is arranged on the optical path of the local beam L2 output from the end of the PMF 8, and collimates the local beam L2. The capillary 6A and the array lens 25 are mounted on a flat surface 39a of a base 39 accommodated within the package 2. The configuration of the capillary 6A and the array lens 25 will be described in detail below.

The receiver module 1A further comprises multi-mode interference (MMI) devices 21 and 22 causing the signal beam L1 and the local beam L2 to interfere with each other. The MMI devices 21 and 22 are an example of the demodulator, and causes the local beam L2 to interfere with the signal beam L1, thereby demodulating information included in the signal beam L1. The MMI devices 21 and 22 contain, for example, an optical 90° hybrid. The MMI devices 21 and 22 are both accommodated in the package 2, and are arranged side by side along the X-direction.

As optical components for optically connecting the respective signal beam input ends of the MMI devices 21 and 22 and the SMF 7, the receiver module 1A is equipped, apart from the above-mentioned array lens 25, with a beam splitter (BS) 26, a polarization beam splitter (PBS) 23, a skew adjustor 24, a reflector 28, and a half wavelength ($\lambda$/2) plate 27. The BS 26, the PBS 23, the skew adjustor 24, the reflector 28, and the $\lambda$/2 plate 27 are accommodated in the package 2, and are mounted on the surface 39a of the base 39. The BS 26 receives the signal beam L1 from one lens of the array lens 25, and separates the signal beam L1 into a signal beam L10 and a monitored beam M1. The signal beam L10 is transmitted through the BS 26. The monitored beam M1 is reflected by the BS26, and progresses in a direction orthogonal to the progressing direction of the signal beam L1. On the optical path of the monitored beam M1, there is provided a photodiode 34. The photodiode 34 is fixed to a side of a carrier 33 mounted on the surface 39a of the base 39. The photodiode 34 receives the monitored beam M1, and outputs an electric signal corresponding to the intensity of the received monitored beam M1.

The PBS 23 is arranged on the optical path of the signal beam L10 transmitted through the BS 26. The PBS 23 has a light incident surface optically connected with the BS 26, and effects branching-off into a signal beam L11 which is one polarization component of the signal beam L10 (e.g., the X-polarization component that is included in the XZ-plane) and a signal beam L12 which is another polarization component (e.g., the Y-polarization component that is included in the YZ-plane). The branching ratio is, for example, 50%. The one signal beam L11 is transmitted through the PBS 23, and heads toward the signal beam input end of the MMI device 21. The progressing direction of the other signal beam L12 is converted by 90° by the PBS 23, and heads for the reflector 28.

The skew adjustor 24 is arranged on the optical path between the PBS 23 and the signal beam input end of the MMI device 21. The one signal beam L11 transmitted through the PBS 23 passes through the skew adjustor 24. The skew adjustor 24 is a block formed, for example, of Si.

The skew adjustor 24 equivalently elongates the optical path length of the signal beam L11, thereby compensating for the phase delay of the other signal beam L12 with respect to the one signal beam L11 attributable to the difference in optical path length. After having passed through the skew adjustor 24, the signal beam L11 is condensed at the signal beam input end of the MMI device 21 by an array lens 37. The other signal beam L12 branched off by the PBS 23 is converted in progressing direction by 90° by the reflector 28, and then heads for the signal beam input end of the MMI device 22.

The $\lambda$/2 plate 27 is arranged on the optical path between the PBS 23 and the signal beam input end of the MMI device 22, more specifically, on the optical path between the reflector 28 and the signal beam input end of the MMI device 22. The other signal beam L12 branched off by the PBS 23 passes through the $\lambda$/2 plate 27. The $\lambda$/2 plate 27 rotates the polarizing direction of the signal beam L12 by 90°. Thus, the polarizing direction of the signal beam L12 having passed through the $\lambda$/2 plate 27 coincides with the polarizing direction of the signal beam L1 having passed through the PBS 23. After passing through the $\lambda$/2 plate 27, the signal beam L12 is condensed at the signal beam input end of the MMI device 22 by an array lens 38.

As an optical component for optically connecting the respective local beam input ends of the MMI devices 21 and 22 and the PMF 8, the receiver module 1A is equipped, apart from the above-mentioned array lens 25, with a polarizer 31 and a beam splitter (BS) 32. The skew adjustor 24 and the reflector 28 described above further optically connect the respective local beam input ends of the MMI devices 21 and 22 with the PMF 8. The polarizer 31 and the BS 32 are accommodated in the package 2, and are mounted on the surface 39a of the base 39.

The polarizer 31 is optically connected with the other lens of the array lens 25, and is arranged on the optical path of the local beam L2 output from the other lens. The polarizer 31 regulates the polarizing direction of the local beam L2. As a result, even if the polarizing direction maintained in the PMF 8 is deviated at the time of the assembly of the package 2, etc., it is possible to extract solely the polarization component of 0° or 90° as the local beam L2. In the case where the light source of the local beam L2 is a semiconductor LD, an elliptical polarization in which the polarization of a component parallel to the activated layer is predominant results. However, in order to attain the oscillation stability of the semiconductor LD, the material reliability, a desired output wavelength, etc., there is sometimes introduced into the activated layer distortion due to lattice mismatching. The laser beam output from such a semiconductor LD can be an elliptical polarized beam the shorter axis of which is relatively long. In such cases also, the polarizer 31 converts the local beam L2 to a linear polarization having a desired polarizing direction, for example, a direction included in the XZ-plane.

The BS 32 branches off in two the local beam L2 output from the polarizer 31. The branching ratio is 50:50. One branched-off local beam L21 is transmitted through the BS 32, and heads for the local beam input end of the MMI device 21. The other local beam L22 is converted in progressing direction by 90° by the BS 32, and then heads for the reflector 28. The skew adjustor 24 is arranged on the optical path between the BS 32 and the local beam input end of the MMI device 21. The local beam L21 transmitted through the BS 32 passes through the skew adjustor 24. The skew adjustor 24 equivalently elongates the optical path length of the local beam L21, thereby compensating for the phase delay of the local beam L22 with respect to the local beam L21 attributable to the difference in optical path length. The local beam L21 passes through the skew adjustor 24, and is then condensed at the local beam input end of the MMI device 21 by the array lens 37.

The local beam L22 is converted in progressing direction by 90° by the reflector 28, and then heads for the local beam input end of the MMI device 22. The local beam L22 reflected by the reflector 28 is condensed at the local beam input end of the MMI device 22 by the array lens 38.

As described above, the signal beam L1 and the local beam L2 input to the interior of the package 2 are respectively distributed to the two MMI devices 21 and 22. The MMI devices 21 and 22 are of a photodiode (PD) accumulation type using, for example, a semiconductor substrate formed of indium phosphorus (InP). The MMI device 21 causes the signal beam L11 and the local beam L21 to interfere with each other, thereby extracting, from one polarization component of the signal beam L1, a signal component of the same phase as the local beam L2 and a signal component differing in phase by 90° from the local beam L2. The MMI device 22 causes the signal beam L12 and the local beam L22 to interfere with each other, thereby extracting, from the other polarization component of the signal beam L1, a signal component of the same phase as the local beam L2 and a signal component differing in phase by 90° from the local beam L2. The PDs accumulated on the MMI devices 21 and 22 convert these signal components to an electric current signal. The PDs accumulated on the MMI device 21 are electrically connected to an amplifier 35 provided inside the package 2. The electric current signal output from the MMI device 21 is converted to a voltage signal by the amplifier 35. The PDs accumulated on the MMI device 22 are electrically connected to an amplifier 36 provided inside the package 2. The electric current signal output from the MMI device 22 is converted to a voltage signal by the amplifier 36.

Figure 3:
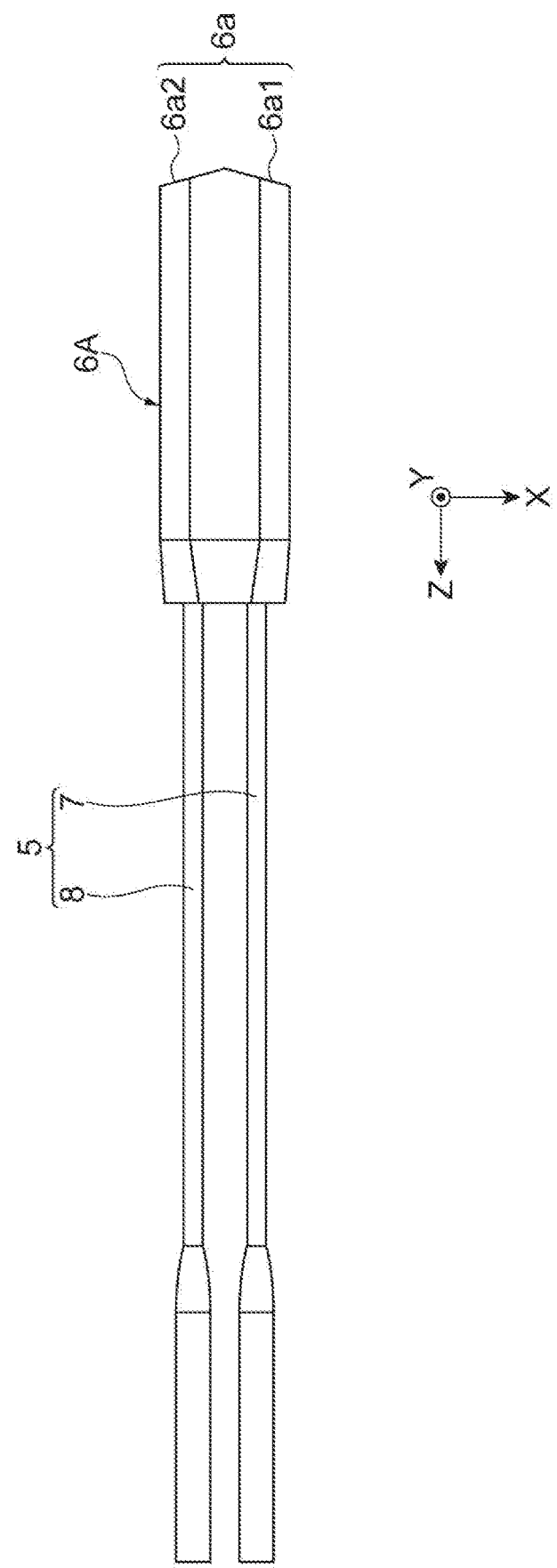
FIG. 3 is a plan view of fibers and a capillary.
Figure 4:
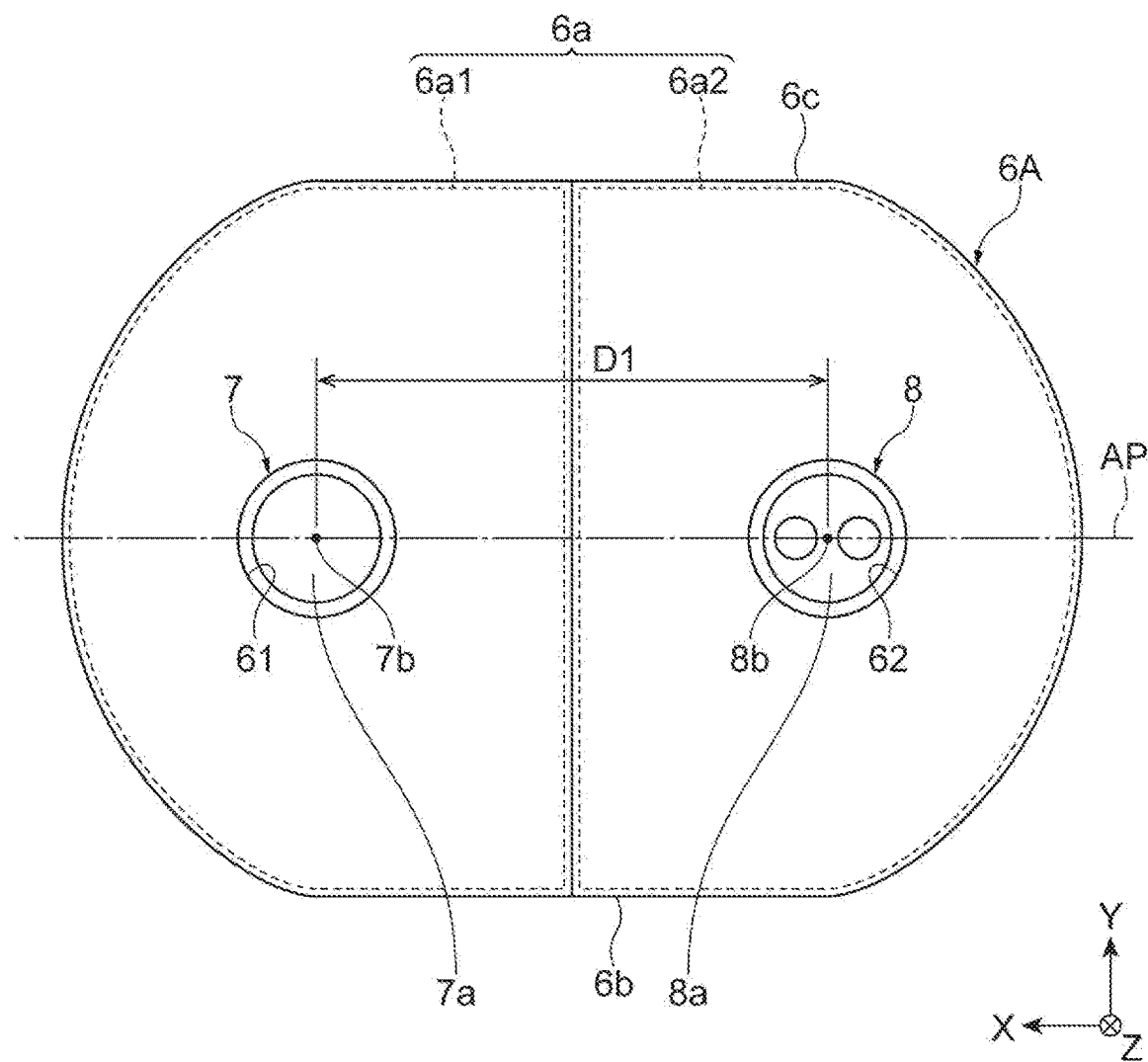
FIG. 4 is a front view of an end of the capillary.

The structure of the capillary 6A and of the array lens 25 will be described in detail. FIG. 3 is a plan view of the fibers 5 and the capillary 6A, and FIG. 4 is a front view of the end 6a of the capillary 6A. As shown in FIG. 3, the SMF 7 and the PMF 8 extend in the Z-direction, and are arranged side by side along the X-direction. The capillary 6A retains the distal ends of the SMF 7 and the PMF 8. The capillary 6A is formed, for example, of zirconia or glass (boro-silicated glass, quartz or the like). As shown in FIG. 4, the outer shape of the capillary 6A as seen from the direction of the axis 7b of the SMF 7 and the axis 8b of the PMF 8 is, for example, an elliptical shape having the longer axis in the X-direction and the shorter axis in the Y-direction. The outer peripheral surface of the capillary 6A includes a pair of flat surfaces 6b and 6c arranged side by side in the Y-direction. The flat surfaces 6b and 6c extend along the XZ-plane, and are parallel to each other. The flat surface 6b faces the surface 39a of the base 39, and is fixed to the surface 39a via adhesive.

As shown in FIG. 4, the capillary 6A has two holes 61 and 62 extending through the capillary 6A along the Z-direction. The holes 61 and 62 are arranged side by side along the X-direction. The SMF 7 is inserted into the hole 61, and is fixed thereto by resin adhesive, and the PMF 8 is inserted into the hole 62, and is fixed thereto by resin adhesive. From the end 6a of the capillary 6A, there are exposed the end 7a of the SMF 7 and the end 8a of the PMF 8. The distance D1 between the center (the axis 7b) of the end 7a of the SMF 7 and the center (the axis 8b) of the end 8a of the PMF 8 in the end 6a ranges, for example, from 250 μm to 750 μm.

The end 6a includes two regions 6a1 and 6a2. The regions 6a1 and 6a2 are arranged side by side in the X-direction while facing the array lens 25. The region 6a1 consists of a flat surface including the end 7a of the SMF 7. In the region 6a1, the end of the capillary 6A and the end 7a of the SMF 7 are flush with each other. The region 6a2 consists of a flat surface including the end 8a of the PMF 8. In the region bat, the end of the capillary 6A and the end 8a of the PMF 8 are flush with each other.

Figure 5:
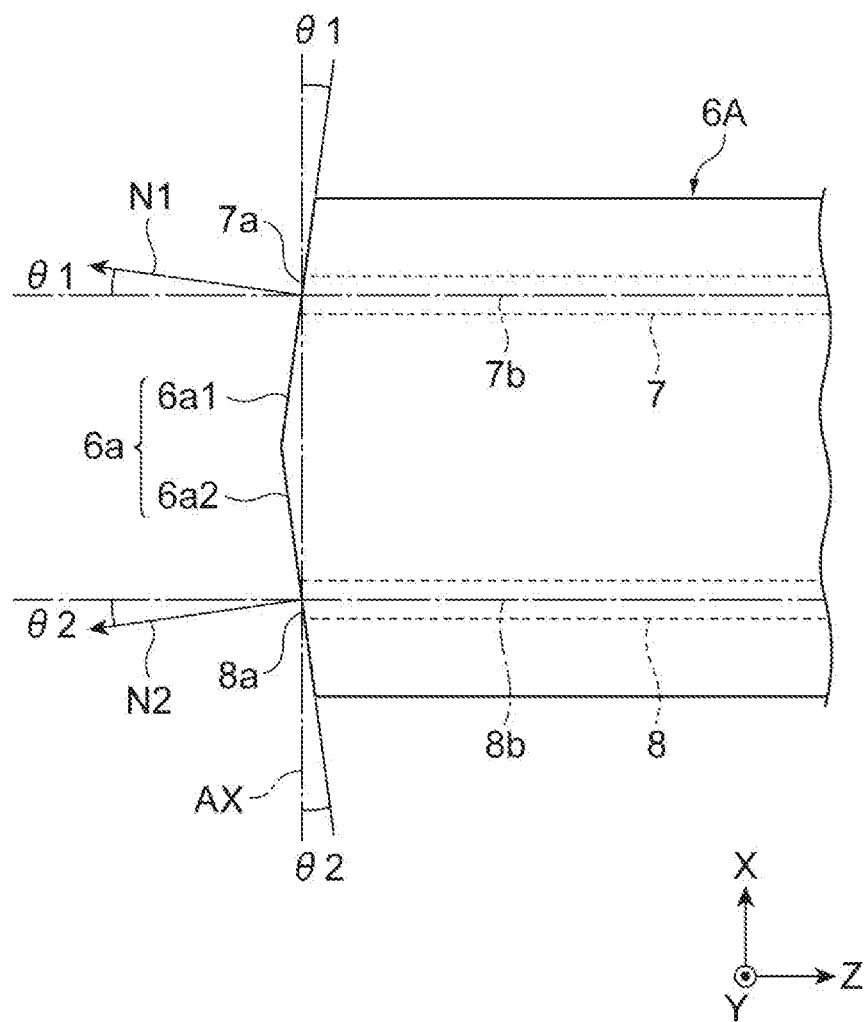
FIG. 5 is an enlarged plan view of a portion near the end of the capillary.

FIG. 5 is an enlarged plan view of a portion near the end 6a of the capillary 6A. FIG. 5 shows a virtual axis AX intersecting both the axis 7b of the SMF 7 and the axis 8b of the PMF 8. In an example, the virtual axis AX is orthogonal to the axes 7b and 8b, and extends along the X-direction. The vector N1 of the region 6a1 is inclined with respect to the axis 7b of the SMF 7. In other words, the region 6a1 is inclined with respect to the virtual axis AX. The vector N2 of the region 6a2 is inclined with respect to the axis 8b of the PMF 8. In other words, the region 6a2 is inclined with respect to the virtual axis AX. The angle θ1 made by the vector N1 and the axis 7b (the angle made by the region 6a1 and the virtual axis AX) and the angle θ2 made by the vector N2 and the axis 8b (the angle made by the region 6a2 and the virtual axis AX) range from 0.1° to 10°, and are, for example, 8°. The angles θ1 and θ2 are equal to each other.

Further, the orientation of inclination of the region 6a1 with respect to the virtual axis AX and the orientation of inclination of the region 6a2 with respect thereto are opposite to each other. In the present embodiment, the vector N1 of the region 6a1 and the vector N2 of the region 6a2 are oriented so as to point away from each other. That is, the respective X-direction components of the vectors N1 and N2 face opposite to the center axis of the capillary along the Z-direction. Thus, the distance in the X-direction between the normal of the region 6a1 and the normal of the region 6a2 increases gradually as they extend away from the end 6a. As a result, the end 6a constitutes a surface of a protrusion triangular in plan view that protrudes in the Z-direction.

The regions 6a1 and 6a2 include the two axes 7b and 8b, and are perpendicular to the virtual surface AP extending along the XZ-plane (See FIG. 4). That is, the regions 6a1 and 6a2 are perpendicular to the flat surfaces 6b and 6c. As a result, the regions 6a1 and 6a2 are perpendicular to the surface 39a of the base 39.

FIG. 6 is a front view of the array lens 25. As shown in FIG. 6, the array lens 25 has two lenses 251 and 252 arranged side by side in the X-direction, and a holder 253. The lenses 251 and 252 are, for example, convex lenses, and are formed of resin, glass, or silicon. The lens 251 is optically connected with the SMF 7, and collimates the signal beam L1. The axis 251a of the lens 251 and the axis 7b of the SMF 7 are adjusted in such a way as to coincide with each other. The lens 252 is optically connected with the PMF 8, and collimates the local beam L2. The axis 252a of the lens 252 and the axis 8b of the PMF 8 are adjusted in such a way as to coincide with each other. The distance D2 between the center of the lens 251 (the axis 251a) and the center of the lens 252 (the axis 252a) is equal to the distance D1 shown in FIG. 4.

The holder 253 fixes the lens 251 and the lens 252 to each other. The holder 253 may be formed of a material different from that of the lenses 251 and 252, or may be formed of the same material as that of the lenses 251 and 252, and integrally molded with the lenses 251 and 252. The outer shape of the holder 253 as seen from the direction of the axes 251a and 252a of the lenses 251 and 252 is of a rectangular shape having, for example, the longer axis in the X-direction and the shorter axis in the Y-direction. The outer peripheral surface of the holder 253 includes a pair of flat surfaces 25b and 25c arranged side by side in the Y-direction. The flat surfaces 25b and 25c extend along the XZ-plane, and are parallel to each other. The flat surface 25b faces the surface 39a of the base 39, and is fixed to the deployment surface 39a via adhesive.

Figure 7A:
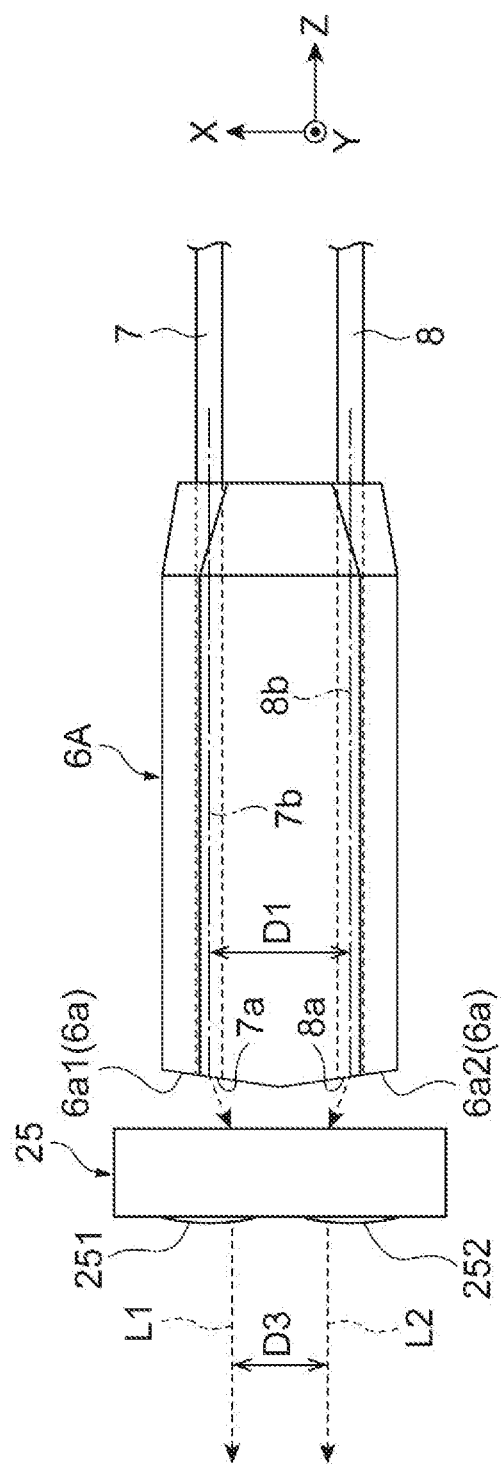
FIG. 7A is a plan view of the capillary and the array lens in a state in which they face each other.
Figure 7B:
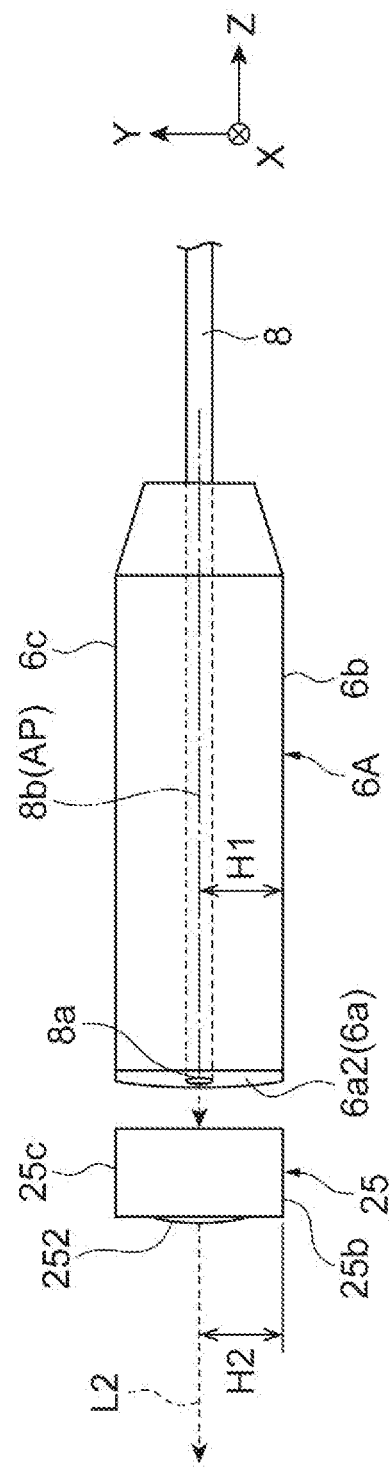
FIG. 7B is a side view of the capillary and the array lens in the state in which they face each other.

FIG. 7A is a plan view of the capillary 6A and the array lens 25 in a state in which they face each other, and FIG. 7B is a side view of the same. The distance between the lens 251 and the end 7a of the SMF 7 is equal to the focal distance of the lens 251. Similarly, the distance between the lens 252 and the end 8a of the PMF 8 is equal to the focal distance of the lens 252. The focal distance of the lens 251 and the focal distance of the lens 252 are equal to each other. Thus, the distance between the lens 251 and the end 7a and the distance between the lens 252 and the end 8a are equal to each other.

When it is output from the end 7a, the signal beam L1 transmitted through the SMF 7 is refracted by a refraction angle corresponding to the angle θ1 shown in FIG. 5 due to Snell's law. Similarly, when it is output from the end 8a, the local beam L2 transmitted through the PMF 8 is refracted by a refraction angle corresponding to the angle θ2 shown in FIG. 5 due to Snell's law. In the case where the above-mentioned angles θ1 and θ2 are 8°, the respective optical paths of the signal beam L1 and the local beam L2 output from the ends 7a and 8a are inclined by 3.5° with respect to the axis 7b of the SMF 7 and the axis 8b of the PMF 8. Here, in the present embodiment, the vector N1 of the region 6a1 and the vector N2 of the region 6a2 are oriented in such a way as to point away from each other. Thus, the closer the optical paths of the signal beam L1 and the local beam L2 after outputting are to each other, the farther away they are from the end 6a. The signal beam L1 and the local beam L2 are again refracted by the lenses 251 and 252, and the signal beam L1 and the local beam L2 having passed through the lenses 251 and 252 are parallel to each other. Thus, the center distance D3 between the signal beam L1 and the local beam L2 having passed through the array lens 25 is smaller than the center distance D1 between the SMF 7 and the PMF 8.

As stated above, the regions 6a1 and 6a2 are perpendicular to the virtual plane AP extending along the XZ-plane. Thus, within the YZ-plane, the signal beam L1 and the local beam L2 are not refracted at the ends 7a and 8a, and also after being output, progress straight along the Z-direction. The height H1 of the axes 7b and 8b of the SMF 7 and PMF 8 using the flat surface 6b of the capillary 6A as a reference and the height H2 of the axes 251a and 252a of the lenses 251 and 252 using the flat surface 25b of the array lens 25 as a reference are equal to each other. As a result, on the flat deployment surface 39a, it is possible to easily perform axis adjustment of the SMF 7 and the PMF 8, and the lenses 251 and 252 in the height direction (the Y-direction).

The effect attained by the receiver module 1A of the present embodiment described above will be described. The receiver module 1A introduces the SMF 7 and the PMF 8 into the interior of the package 2 from the exterior thereof, and accommodates the capillary 6A retaining the respective distal ends of the SMF 7 and the PMF 8 in the package 2. In this configuration, it is possible to omit the connector structure protruding from the side of the package 2 to achieve a reduction in the size of the receiver module 1A. Further, the lens 251 and the lens 252 provided respectively for the SMF 7 and the PMF 8 are integrated (arrayed) by the holder 253, so that in the receiver module 1A, it is possible to diminish the center distance D2 between the lens 251 and the lens 252. As a result, it is possible to diminish the center distance D1 between the SMF 7 and the PMF 8, making it possible to achieve a further reduction in the size of the receiver module 1A. Further, in the capillary 6A, the normal of the region 6a1 including the first end of the SMF 7 is inclined with respect to the axis of the SMF 7, and the normal of the region 6a2 including the second end of the PMF 8 is inclined with respect to the axis of the PMF 8. As a result, it is possible to suppress the reflection return light at the ends 7a and 8a.

Figure 12:
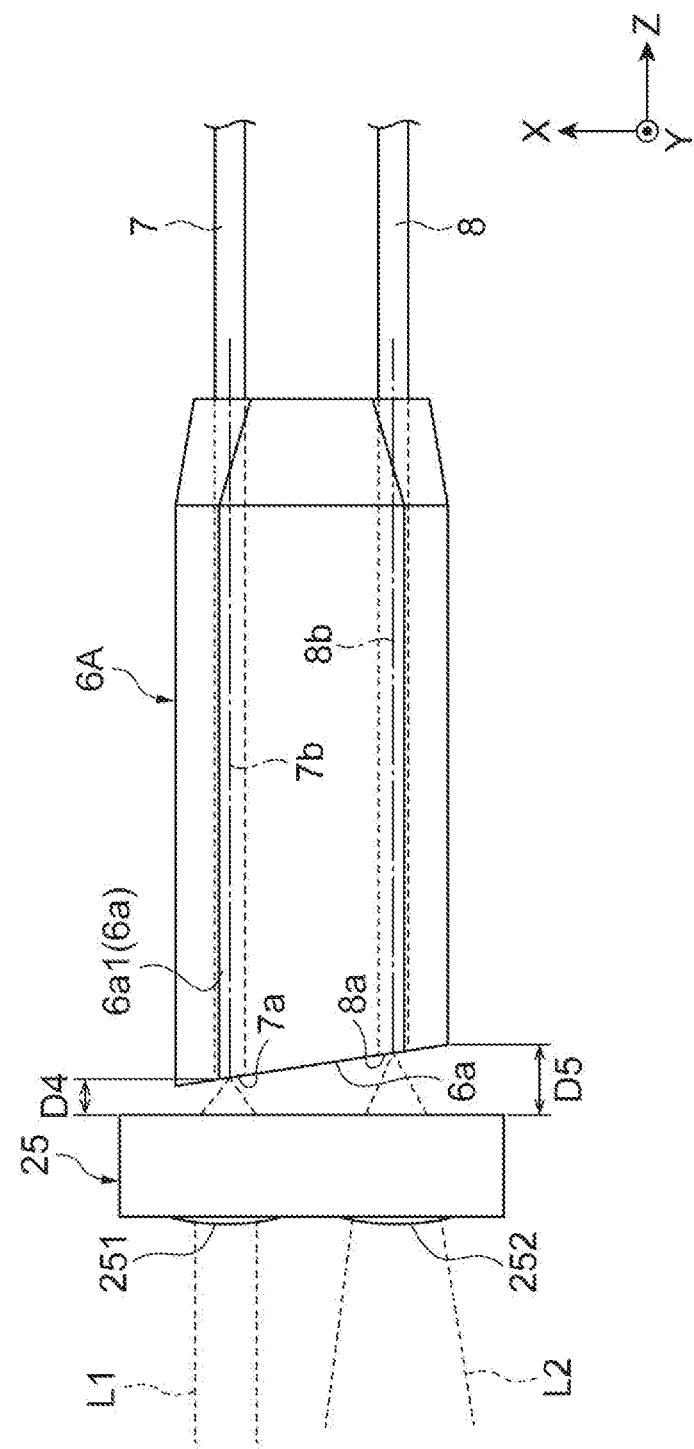
FIG. 12 is a plan view illustrating a case in which the end of the capillary is inclined in one direction with respect to a virtual axis AX.

Here, in order to suppress the reflection return light, it might be possible to incline the end 6a of the capillary 6A in one direction with respect to the virtual axis AX as shown in FIG. 12, for example. In that case, however, the distance D4 between the lens 251 and the end 7a and the distance D5 between the lens 252 and the end 8a are different from each other. Thus, in the case where the focal distances of the lenses 251 and 252 are equal to each other, one beam is allowed to be dispersed as shown in the drawing, making it difficult accurately to achieve a collimated beam. This problem might be avoided by individually setting the focal distances of the lenses 251 and 252. That, however, would complicate the machining of the array lens 25, and it would be necessary to take into consideration the position relationship between the lenses 251 and 252 when arranging the array lens 25 on the surface 39a, resulting in a rather complicated assembly process. In contrast, in the present embodiment, the orientation of inclination of the region 6a1 with respect to the virtual axis AX and the orientation of inclination of the region 6a2 with respect thereto are opposite to each other. As a result, the distance between the lens 251 and the end 7a and the distance between the lens 252 and the end 8a can be made equal to each other, so that even in the case where the focal distances of the lenses 251 and 252 are equal to each other, it is possible to collimate both the signal beam L1 and the local beam L2 without diffusing any of them. By making the focal distances of the lenses 251 and 252 equal to each other, the machining of the array lens 25 is facilitated. Further, when arranging the array lens 25 on the deployment surface 39a, any of the two lenses may be the lens 251 (252), so that the assembly is facilitated.

Figure 13A:
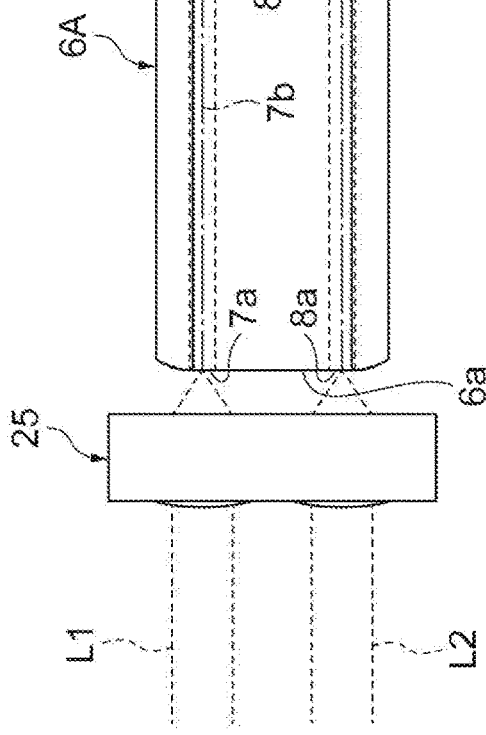
FIG. 13A is a plan view illustrating a case in which the normal of the end of the capillary is inclined with respect to a virtual surface AP.
Figure 13B:
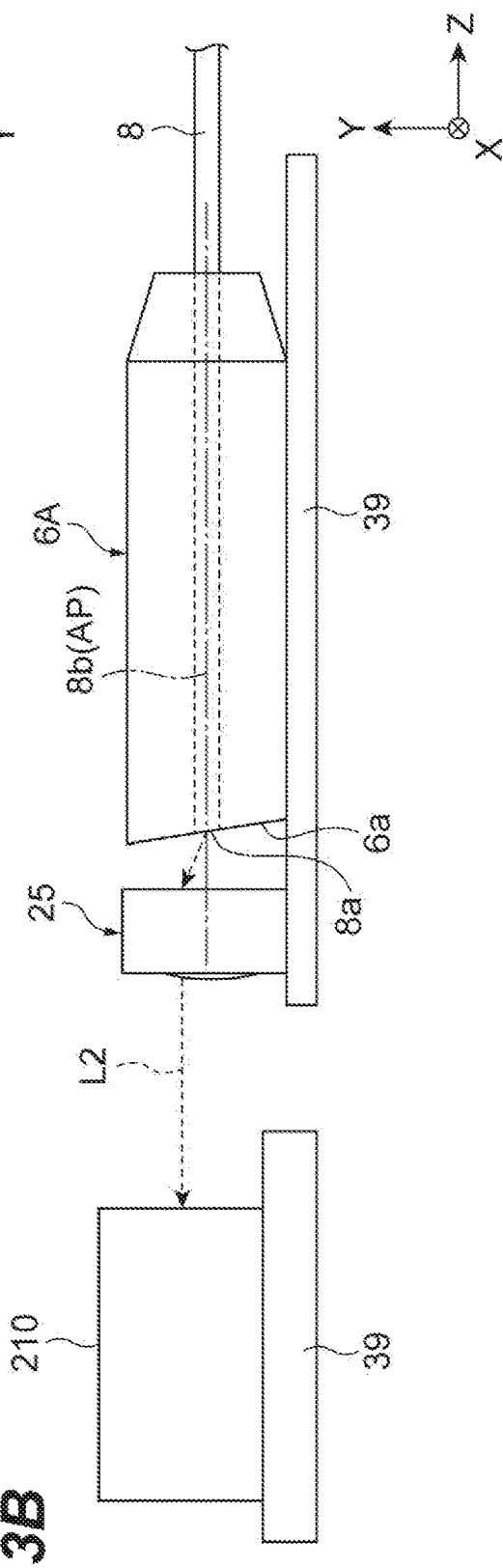
FIG. 13B is a side view illustrating a case in which the normal of the end of the capillary is inclined with respect to the virtual surface AP.

In order to suppress the reflection return light, it might be possible to incline the normal of the end 6a of the capillary 6A with respect to the virtual surface AP as shown in FIGS. 13A and 13B, for example. In that case, however, the signal beam L1 and the local beam L2 would be refracted in the YZ-plane when output from the ends 7a and 8a. As a result, the optical paths of the signal beam L1 and the local beam L2 after they have passed through the array lens 25 would be shifted in a direction intersecting the virtual surface AP with respect to the axes 7b and 8b of the SMF 7 and the PMF 8, that is, in the height direction of the package 2 (the Z-direction). Then, the axis of each optical component arranged on the output side of the array lens 25 (the optical component 210 in the drawing) would have to be shifted in the height direction, resulting in increase in the height of the package 2, an increase in the number of components due to the division of the base 39, complicated axis design, etc. In contrast, in the present embodiment, it is possible to make the region 6a1 and the region 6a2 perpendicular to the virtual surface AP. As a result, the signal beam L1 and the local beam L2 can progress along the virtual surface AP, making it possible to suppress shifting of the optical paths of the signal beam L1 and the local beam L2 in a direction intersecting the vertical surface AP (the height direction of the package 2). Therefore, it is possible to suppress an increase in the height of the package 2 and to suppress an increase in the number of components due to the division of the base 39 and complication of the axis design.

[Modification]

Figure 8:
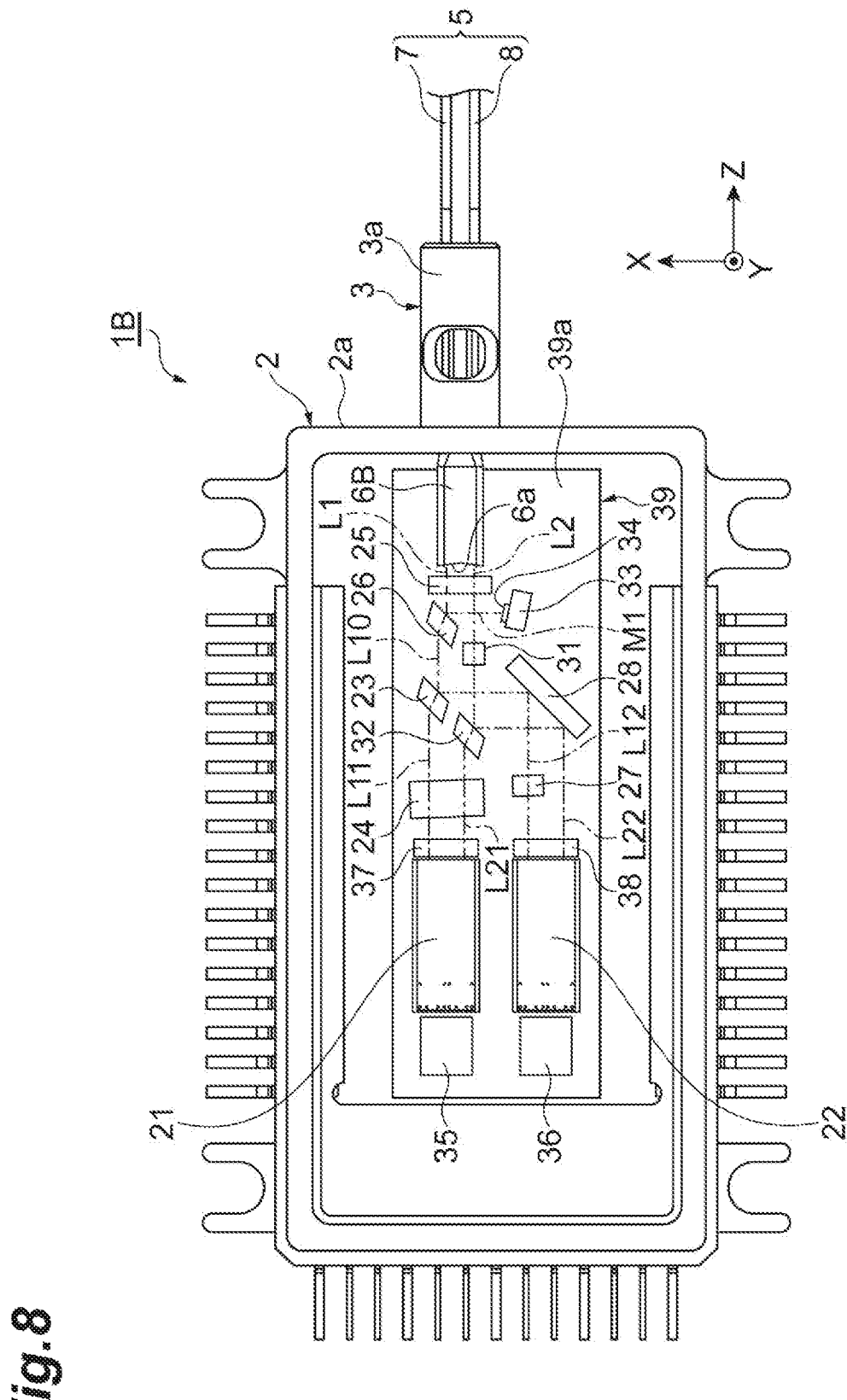
FIG. 8 is a plan view of the inner structure of a receiver module according to a modification.

FIG. 8 is a plan view of the inner structure of a receiver module 1B according to a modification of the above-described embodiment. Instead of the capillary 6A of the above-described embodiment, the receiver module 1B comprises a capillary 6B. Otherwise, the receiver module 1B is of the same structure as that of the above-described embodiment, so a detailed description thereof will be left out. The capillary 6B differs from the capillary 6A of the above-described embodiment in the configuration of the end 6a.

Figure 9:
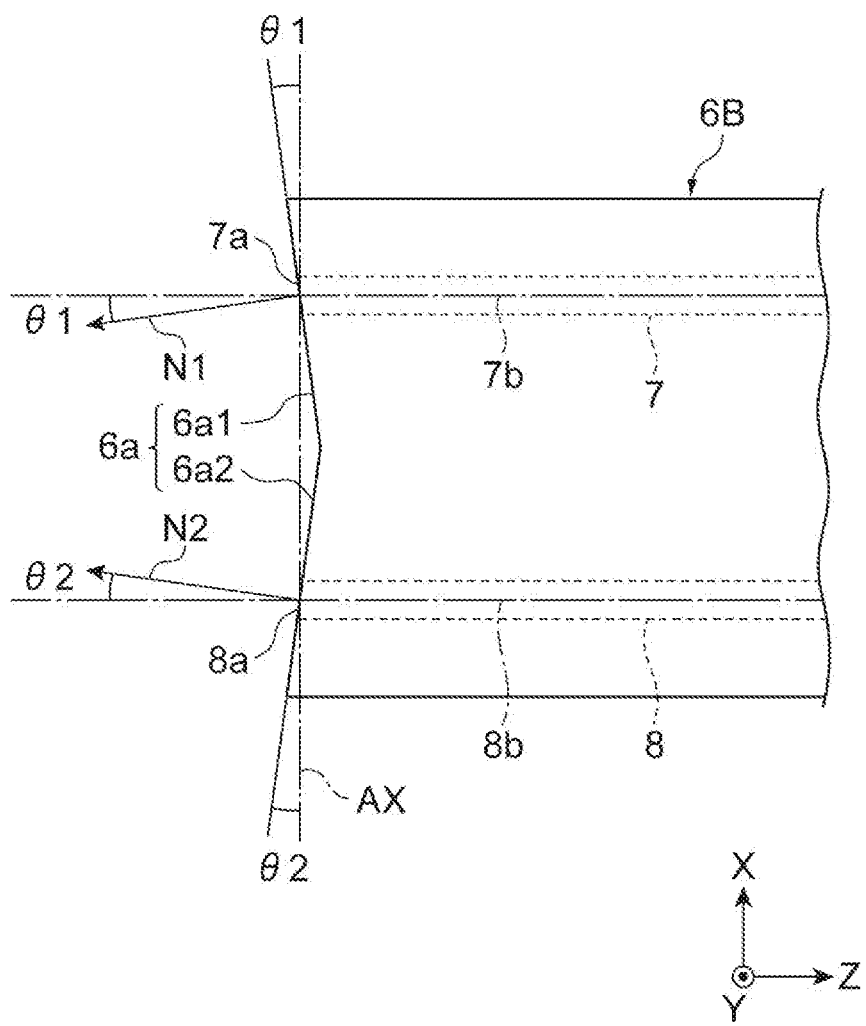
FIG. 9 is an enlarged plan view of a portion near the end of the capillary according to the modification.

FIG. 9 is an enlarged plan view of a portion near the end 6a of the capillary 6B of the present modification. Also in the present modification, the vector N1 of the region 6a1 is inclined with respect to the axis 7b of the SMF 7. The vector N2 of the region 6a2 is inclined with respect to the axis 8b of the PMF 8. The orientation of inclination of the region 6a1 with respect to the virtual axis AX and the orientation of inclination of the region 6a2 with respect thereto are opposite to each other. The magnitude of the angle θ1 made by the vector N1 and the axis 7b and the magnitude of the angle θ2 made by the vector N2 and the axis 8b are same as that in the above-described embodiment. The regions 6a1 and 6a2 include the two axes 7b and 8b, and are perpendicular to the virtual surface AP along the XZ-plane (See FIG. 4).

In the present modification, however, the vector N1 of the region 6a1 and the vector N2 of the region 6a2 are oriented in such a way as to approach each other. That is, the respective X-direction components of the vectors N1 and N2 are oriented to the center axis of the capillary 6B extending along the Z-direction. Thus, the distance in the X-direction between the normal of the region 6a1 and the normal of the region 6a2 is gradually diminished as they extend away from the end 6a. As a result, the end 6a constitutes the surface of a recess that is recessed in the Z-direction and that is triangular in plan view.

FIG. 10A is a plan view of how the capillary 6B and the array lens 25 face each other, and FIG. 10B is a side view of the same. Also in the present modification, the distance between the lens 251 and the end 7a of the SMF 7 is equal to the focal distance of the lens 251. Similarly, the distance between the lens 252 and the end 8a of the PMF 8 is equal to the focal distance of the lens 252. The focal distance of the lens 251 and the focal distance of the lens 252 are equal to each other. Thus, the distance between the lens 251 and the end 7a and the distance between the lens 252 and the end 8a are equal to each other.

When it is output from the end 7a, the signal beam L1 transmitted through the SMF 7 is refracted by a refraction angle corresponding to the angle θ1 shown in FIG. 9 due to Snell's law. Similarly, when it is output from the end 8a, the local beam L2 transmitted through the PMF 8 is refracted by a refraction angle corresponding to the angle θ2 shown in FIG. 9 due to Snell's law. In the present modification, the vector N1 of the region 6a1 and the vector N2 of the region 6a2 are oriented in such a way as to approach each other, so that the optical paths of the signal beam L1 and the local beam L2 after outputting are farther away from each other as they extend away from the end 6a. The signal beam L1 and the local beam L2 are again refracted at the lenses 251 and 252, and, after passing through the lenses 251 and 252, the signal beam L1 and the local beam L2 become parallel to each other. Thus, the center distance D3 between the signal beam L1 and the local beam L2 having passed through the array lens 25 is larger than the center distance D1 between the SMF 7 and the PMF 8.

According to the present modification, it is possible to achieve the following effect in addition to the effect of the above-described embodiment. That is, in the present modification, the vector N1 of the region 6a1 and the vector N2 of the region 6a2 are oriented in such a way as to approach each other, so that the center distance D3 between the signal beam L1 and the local beam L2 having passed through the array lens 25 can be made larger than the center distance D1 between the SMF 7 and the PMF 8. Typically, the distance between the signal beam L1 and the local beam L2 having passed through the array lens 25 is in accordance with the distance between the signal beam input end and the local beam input end of the MMI device 21. Accordingly, the center distance D1 between the SMF 7 and the PMF 8 can be diminished. Thus, the receiver module can be further reduced in size.

In manufacturing the receiver module 1B, it is desirable for one of the polarizing directions orthogonal to each other at the PMF 8 to be parallel to the flat surface 6b. It may occur, however, that the polarizing direction is slightly inclined with respect to the flat surface 6b due to a manufacturing error or the like. FIG. 11A is a front view of the end 6a, illustrating how the polarizing direction of the PMF 8 is inclined by an angle φ with respect to the flat surface 6b. In this case, in order that the polarizing direction may be parallel to the surface 39a of the base 39 when bonding the capillary 6B to the base 39, the capillary 6B is rotated by the angle φ around the axis along the Z-direction (See FIG. 11B). Then, as a result of the rotation of the capillary 6B, the position of the axis 7b of the SMF 7 fluctuates. More specifically, the axis 7b moves by D1·sin φ in the Y-direction, and moves by D1·(1−cos φ) in the X-direction. As a result, the axis 7b and the axis 251a of the lens 251 are slightly deviated from each other, resulting in deterioration in the optical connection efficiency of the lens 251 and the MMI devices 21 and 22. The larger the center distance between the SMF 7 and the PMF 8, the larger the fluctuation amount of the axis 7b of the SMF 7, and the further the deterioration of the optical connection efficiency. According to the present modification, it is possible to diminish the center distance D1 as described above, so that it is possible to suppress such deterioration in optical connection efficiency to a minimum.

The present invention is not restricted to the above-described embodiment of the receiver module according to the present disclosure. That is, various changes are possible without departing from the scope of the gist of the invention as set forth in the appended claims as can be easily recognized by those skilled in the art.

While in the embodiment and the modification described above the capillary end is formed solely by the first region and the second region, the capillary end may include a region other than these (e.g., the region along the virtual axis AX). In the present disclosure, it is only necessary that the first region should include the end of the first fiber and that the second region should include the end of the second fiber, and provision of some other region between the first region and the second region or around the first region and the second region is not prohibited. The other region may be flat or curved.

What is claimed is:

1. A receiver comprising:
a package housing a multi-mode interference (MMI) device;
a first optical fiber having a first edge coupling to the MMI device by propagating a signal beam, and inserted into inside from outside of the package;
a second optical fiber having a second edge coupling to the MMI device by propagating a local beam, and inserted into inside from outside of the package along with the first optical fiber;
a capillary holding heads of the first optical fiber and the second optical fiber, and housed in the package; and
an array lens having a first lens, a second lens, and a connection fixing the first lens and the second lens, wherein the first lens converts the signal beam into a first collimating beam and is located on a first optical axis of the first optical fiber, and the second lens converts the local beam into a second collimating beam and is located on a second optical axis of the second optical fiber;
wherein the capillary has an edge opposite to the array lens, and the edge has a first region including the first edge and a second region including the second edge,
wherein the first edge is slanted to the first optical axis, and the second edge is slanted to the second optical axis, and a direction of the first edge and a direction of the second edge are different each other.

2. The receiver according to claim 1, wherein a vector of the first region and a vector of the second region are oriented in such a way as to approach each other.

3. The receiver according to claim 1, wherein a vector of the first region and a vector of the second region are oriented in such a way as to point away from each other.

4. The receiver according to claim 1, wherein the first region and the second region are perpendicular to a virtual surface including respective axes of the first fiber and the second fiber.

5. The receiver according to claim 1,
wherein the capillary and the array lens are arranged on a deployment surface of a base housed in the package; and
wherein heights of respective axes of the first optical fiber and the second optical fiber using a surface of the capillary facing the deployment surface as a reference and heights of the respective axes of the first lens and the second lens using a surface of the array lens facing the deployment surface as a reference are equal to each other.

* * * * *